(12) United States Patent
Otto et al.

(10) Patent No.: US 8,953,388 B2
(45) Date of Patent: Feb. 10, 2015

(54) MEMORY CELL ASSEMBLY INCLUDING AN AVOID DISTURB CELL

(75) Inventors: Michael Otto, Weinböhla (DE); Nigel Chan, Dresden (DE)

(73) Assignee: Globalfoundries, Inc., Grand Cayman (KY)

( * ) Notice: Subject to any disclaimer, the term of this patent is extended or adjusted under 35 U.S.C. 154(b) by 0 days.

(21) Appl. No.: 13/586,136

(22) Filed: Aug. 15, 2012

(65) Prior Publication Data

US 2014/0050033 A1 Feb. 20, 2014

(51) Int. Cl.
*G11C 11/419* (2006.01)

(52) U.S. Cl.
USPC ............ 365/189.02; 365/189.15; 365/189.16; 365/190; 365/156

(58) Field of Classification Search
USPC ........... 365/189.02, 189.15, 189.16, 190, 156
See application file for complete search history.

(56) References Cited

U.S. PATENT DOCUMENTS

| | | | | |
|---|---|---|---|---|
| 5,886,930 A * | 3/1999 | Maclellan et al. | ........ | 365/189.05 |
| 2007/0047349 A1 * | 3/2007 | Tokito | ............ | 365/203 |
| 2008/0247221 A1 * | 10/2008 | Houston | ........ | 365/154 |
| 2009/0303776 A1 * | 12/2009 | Mair | ............ | 365/154 |
| 2010/0091585 A1 * | 4/2010 | Wang | ........ | 365/189.011 |

* cited by examiner

*Primary Examiner* — Huan Hoang
*Assistant Examiner* — Jay Radke
(74) *Attorney, Agent, or Firm* — Ingrassia Fisher & Lorenz, P.C.

(57) ABSTRACT

A memory array assembly and a method for performing a write operation without disturbing data stored in other SRAM cells are provided. The memory array assembly comprises a plurality of SRAM cells, a plurality of avoid-disturb cells, a plurality of sense amplifiers and a plurality of write drivers. The SRAM cells are arranged in rows and columns, wherein each column is coupled to an avoid-disturb cell, a sense amplifier, and a write driver. The avoid-disturb cell receives a select signal capable of assuming first or second states. An output of the sense amplifier is coupled to an input of the write driver when the select signal is in the first state. A data-in bus is coupled to the input of the write driver if the select signal is in the second state. The write driver then sends the output signal to the SRAM cell.

16 Claims, 4 Drawing Sheets

US 8,953,388 B2

MEMORY CELL ASSEMBLY INCLUDING AN AVOID DISTURB CELL

TECHNICAL FIELD

Embodiments of the subject matter described herein relate generally to memory cells. More particularly, embodiments of the subject matter described herein relate to a memory cell assembly having an avoid disturb cell.

BACKGROUND

Static random access memory (SRAM) and dynamic random access memory (DRAM) are two examples of random access memory used to store digital data. DRAM cells have one transistor and one capacitor, which stores a single bit of data based on the charge of the capacitor. Since the charge of a capacitor will diminish over time, continuous refreshing of the charge on the capacitor is required to retain the data bit. However, SRAM cells have multiple transistors and do not require continuous refreshing of the charge, allowing for storage of a data bit indefinitely as long as power is supplied.

An embodiment of a six transistor SRAM cell comprises four transistors that form two cross-coupled inverters and two pass-gate transistors, connecting the inverters to a first bitline and a second bitline. The two pass-gate transistors are controlled by a wordline that operates the read or write functions of the SRAM. In a read operation, the pass-gate transistors are switched on after the bitlines are precharged and allowed to float, allowing the state retained at storage nodes of the cross coupled inverters to be transferred to the bitlines. In a write operation, the pass-gate transistors are switched on, and the voltage on the bitline or the complementary bitline is raised to a certain level to alter the memory state of the cell.

The six transistor SRAM cell is known to suffer from a lack of stability and writeability. The stability issue occurs when a current through the pass-gate increases a bias on the internal node above the switching point of the inverter, causing the SRAM cell to switch states. The writeability issue occurs when a current discharge through the pass-gate fails to lower the bias on the internal node, preventing the cell from being written.

Optimization and targeting of the SRAM cell may be used to optimize between writeability and stability. But in specific applications, device targeting is not sufficient for both the read and write requirements. In these applications two additional transistors can be added to the six transistor SRAM cell to create a separate read port. This allows for a SRAM cell to be read from without discharging the internal nodes, which avoids the stability issues described above. While this improves the read operation, all SRAM cells along a particular wordline must be written simultaneously. This requires additional power that could be conserved if all cells along the wordline did not need to be written.

Considering the foregoing, it would be desirable to provide a memory array that allows an individual SRAM cell to be written without requiring all SRAM cells along a wordline to be written. This permits optimization of power usage and array size. Furthermore, other desirable features and characteristics will become apparent from the following detailed description and the appended Claims taken in conjunction with the accompanying drawings and this Background.

BRIEF SUMMARY

An embodiment of a memory cell assembly is provided. The memory cell assembly comprises an avoid disturb cell coupled to an SRAM cell. The SRAM cell provides an output signal to the avoid disturb cell, which also receives a select signal and an input data signal for selectively providing one of the output data signal and the input data signal to the SRAM cell.

Also provided is an embodiment of a memory array assembly. The memory array assembly comprises a plurality of SRAM cells arranged in rows and columns. Each one of a plurality of avoid-disturb cells is coupled to a respective column of the plurality of columns. Each column provides an output signal to its respective avoid-disturb cell. The avoid-disturb cell outputs an output data signal and receives an input data signal and a select signal for selectively providing one of the output data signal and the input data signal to the SRAM cell.

A method for avoiding disturb on select cells in an memory array assembly while performing a write operation on the remaining cells is also provided. A memory cell assembly comprises a SRAM cell, a sense amplifier, a write driver and an avoid-disturb cell. The avoid-disturb cell receives a select signal capable of assuming first or second states. An output of the sense amplifier is coupled to an input of the write driver when the select signal is in the first state. A data-in bus is coupled to the input of the write driver if the select signal is in the second state. The write driver then outputs a signal to the SRAM cell.

DETAILED DESCRIPTION

The following detailed description of the invention is merely illustrative in nature and is not intended to limit the embodiments of the subject matter or the application and uses of such embodiments. As used herein, the word "exemplary" means "serving as an example, instance or illustration." Any implementation described herein as exemplary is not necessarily to be construed as preferred or advantageous over other implementations. Furthermore, there is no intention to be bound by any expressed or implied theory presented in the preceding Technical Field, Background, Brief Summary or the following Detailed Description The following description refers to elements or nodes or features being "connected or "coupled" together. As used herein, unless expressly stated otherwise, "coupled" means that one element/node/feature is mechanically joined to and/ or directly or indirectly communicates with another element/ node/feature. Likewise, unless expressly stated otherwise, "connect" means that one element/node feature is mechanically joined to and/or directly communicates with another element/node/feature.

For SRAMs with a read port, if the data contained in a single SRAM cell in a memory array is required to be altered, all cells coupled to the cell's write wordline must be rewritten. This requires additional power that could be conserved if only the data contained in an individual cell could be altered while retaining the current data in all other cells along a write wordline. Embodiments of the present disclosure accomplish this by incorporating additional circuitry to each column of the memory array to retain the current data in all cells except the one cell that is desired to be altered. In addition, two other advantages are realized when the present embodiment is utilized in a fixed and variable bus width SRAM arrays. In fixed bus width SRAM arrays, the physical array size can be decoupled from the bus width. This allows the layout dimension of the array to be tailored to the chip design. Meanwhile, in variable bus width SRAM arrays, data granularity can be improved by varying the word width. Also power can be conserved by only writing a subset of the SRAM cells that are required to be altered.

Figure 1:
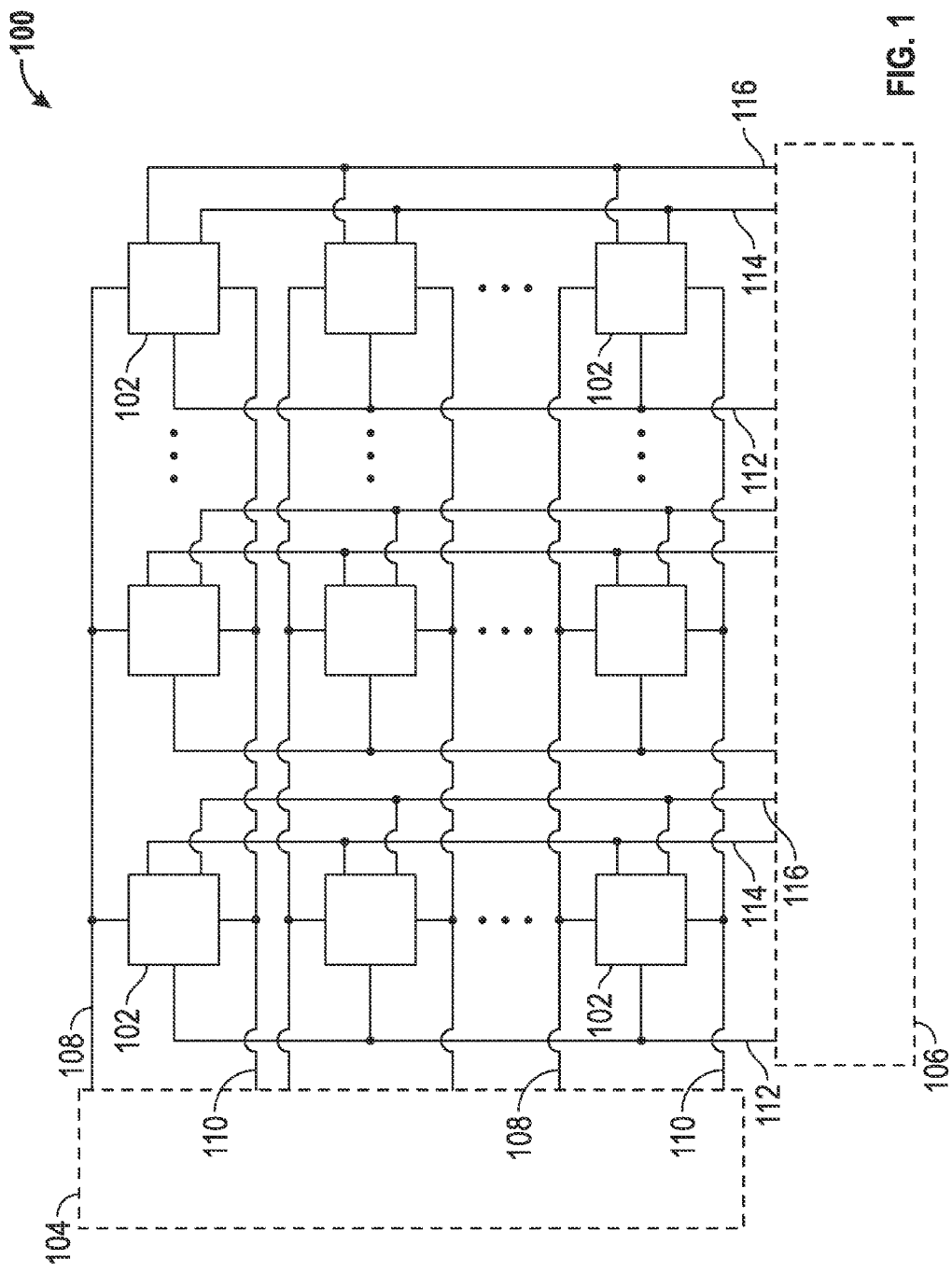
FIG. 1 is a block diagram of a SRAM memory array having a read port separate from a write port.

FIG. 1 illustrates a block diagram of a memory array assembly 100 according to a present embodiment. The memory array assembly 100 includes a plurality of SRAM cells 102 arranged in rows and columns, a row periphery 104, and a column periphery 106. Each SRAM cell 102 is coupled to the row periphery 104 by one of a plurality of write wordlines 108, and one of a plurality of read wordlines 110. The wordlines 108 and 110 provide access to the row of SRAM cells 102 in the memory array assembly 100. Each SRAM cell is also coupled to the column periphery 106 by a first 112 and a second 114 of a plurality of write bitlines and one of a plurality of read bitlines 116. The first write bitline 112 is a complement of the second write bitline 114. The bitlines 112, 114, and 116 provide access to the column of SRAM cells 102 in the memory array assembly 100.

Figure 2:
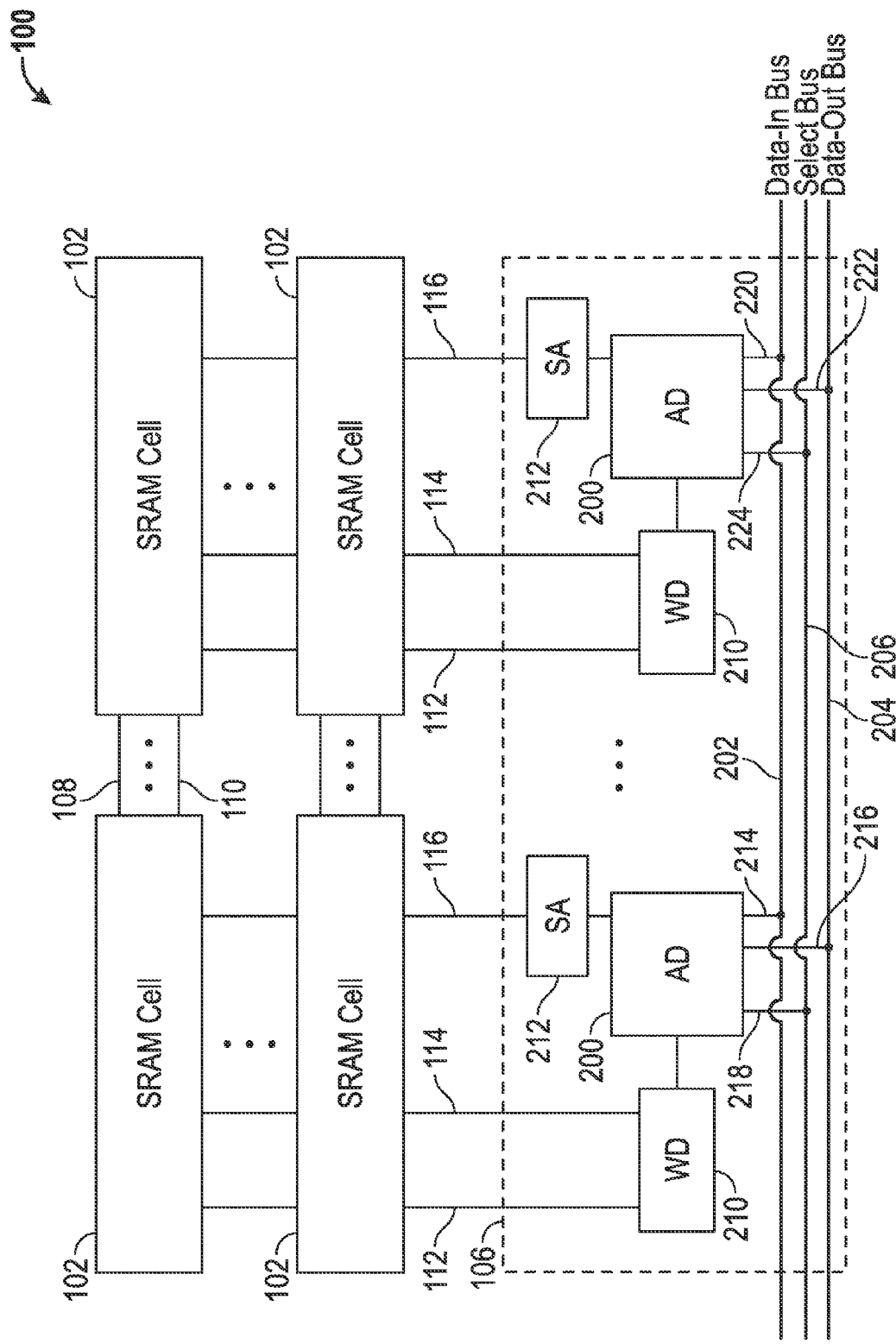
FIG. 2 is a block diagram of a memory array assembly including a avoid disturb cell in accordance with an embodiment.

The column periphery 106 comprises a plurality of avoid disturb (AD) cells 200, a plurality of write drivers (WD) 210, and a plurality of sense amplifiers (SA) 212, shown in FIG. 2. Each one of the plurality of write drivers has a first output terminal that is coupled to one of the columns of the SRAM cells first input terminal by the first write bitline 112. In addition, each one of the plurality of write drivers also has a second output terminal that is coupled to one of the columns of the SRAM cells second input terminals by the second write bitline 114. The write driver 210 discharges either the first write bitline 112 or the second write bitline 114 from the charged level to substantially ground level to store the data in the SRAM cell 102.

An input of each one of the plurality of the sense amplifiers 212 is coupled to one of the read bitline 116, while the output of the sense amplifier 212 is coupled to a Data-Out bus 204 and a avoid-disturb cell 200. The sense amplifier 212 generates the logic state of the selected SRAM cell 102 from the current it receives from the SRAM cell.

Each one of the plurality of avoid-disturb cells 200 has a select terminal coupled to a select bus 206, a first input terminal coupled to the Data-In bus 202, and a second output terminal coupled to a Data-out bus 204. The avoid-disturb cells select terminals are labeled "Select<0>" 218-"Select<n>" 224, the first input terminals are labeled "Data-In<0>" 214-"Data-In<n>" 220, and the second output terminals are labeled "Data-Out<0>" 216-"Data-Out<n>" 222. The select terminal receives a select signal that provides a data signal from either the first terminal or the second terminal to an output of the avoid-disturb cell 200. The output of the avoid-disturb cell 200 is coupled to the input of the write driver 210 for receiving the data signal.

To avoid disturbing the data stored in the SRAM cells 102 during a write operation, the memory array assembly 100 may selectively retain the current data in the SRAM cells 102. The memory array assembly 100 retains the current data in the SRAM cells 102, when the avoid-disturb cell 200 receives the select signal from the select data bus 206 that couples the output of the sense amplifier 212 to the input of the write driver 210. Alternatively, the memory array assembly alters the current data in the SRAM cells when the avoid-disturb cell 200 receives the select signal from the select bus 206 that couples the input signal from the input data bus 202 to the to the input of the write driver 210. By selectively providing a data signal from either the sense amplifier 212 or the Data-In bus 202 to the input of the write driver 210, data contained in a plurality of SRAM cells 102 along a write wordline 108 may be retained, while data in other cells along the write wordline 108 may be altered.

Figure 3:
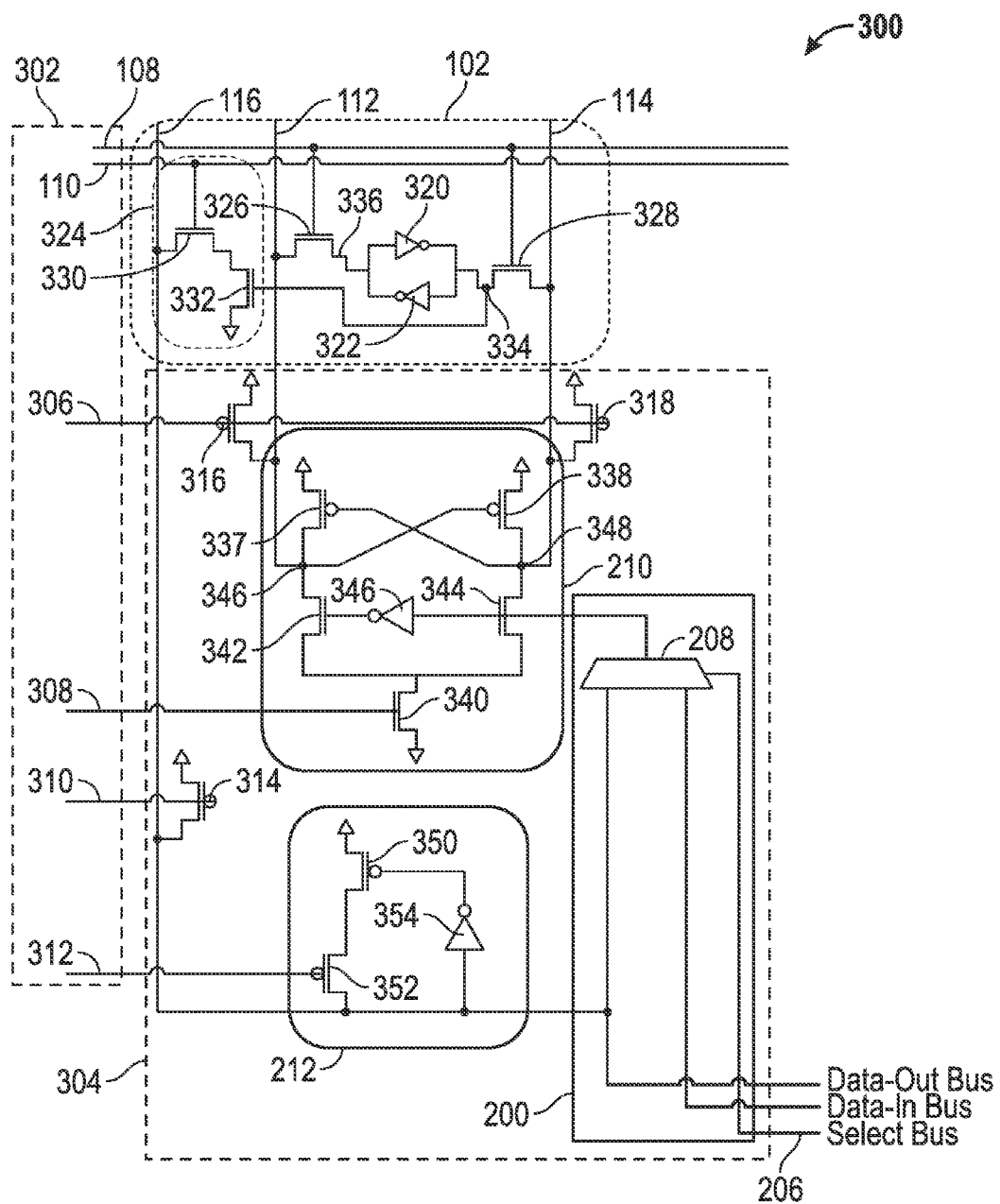
FIG. 3 is a schematic diagram of a memory cell assembly including a avoid-disturb cell in accordance with an embodiment.

FIG. 3 is an illustration of an embodiment of the memory cell assembly 300 comprised of one SRAM cell 102, a part of the row periphery 302, and a part of the column periphery 304 of the memory array assembly 100 shown in FIGS. 1 and 2. The part of the column periphery 304 comprises an embodiment of the avoid disturb cell 200, the write driver 210, and the sense amplifier 212, which is suitable for use in the memory array assembly 100. The part of the row periphery 302 comprises a plurality of terminals coupled to the read wordline 110, the write wordline 108, a write pre-charge line 306, a write enable 308, a read pre-charge line 310, and a read enable line 312 required for operation of the memory array assembly 100.

For the exemplary embodiments described herein, the SRAM cell 102, the part of the row periphery 302, and the part of the column periphery 304 are fabricated on an appropriate semiconductor substrate. These semiconductor-based circuits can be formed using well known techniques and process steps (e.g., photolithography, doping, etching, patterning, material growth, material deposition, and the like) that will not be described in detail here. The semiconductor material used is preferably silicon. Alternatively, the semiconductor material can be germanium, gallium arsenide, or the like. The semiconductor material can be used to fabricate an N-type metal-oxide-semiconductor (NMOS) transistors or P-type metal-oxide-semiconductor (PMOS) transistors. The NMOS transistors comprise a source, a drain, a gate, and a bulk that is coupled to a ground, while the PMOS transistors comprise a source, a drain, a gate, and a bulk that is coupled to a power supply.

Additional circuitry may be coupled to the part of the column periphery 302 to charge the read bitline 116 or the first write bitline 112 and the second write bitline 114. The read pre-charge line 310 charges the read bitline 116 to enable the SRAM cell to enter a read state when the read wordline 110 is enabled. The read pre-charge line 310 employs a PMOS transistor 314 that has a gate coupled to the read pre-charge line 310, a source coupled to a power supply and a drain coupled to the read bitline 116. The write pre-charge line 306 charges either the first 112 or the second 114 write bitlines to a power supply before the write wordline 108 is enabled to write the data into the SRAM cell. The write pre-charge line 306 utilizes two PMOS transistors 316 and 318 that have their gates coupled to the write pre-charge line 306, both sources coupled to a power supply and the drain of each transistor is coupled to the first 112 and second 114 write bitlines, respectively.

The SRAM cell 102 shown in FIG. 3 comprises eight transistors, which form a pair of cross-coupled inverters 320 and 322, a read port 324 and a pair of pass-gate transistors 326 and 328. Alternatively, the SRAM cell 102 can be embodied with any number of transistors having a read port that is separate from a write port. The separate ports allow the SRAM cell 102 to perform a read operation without disturbing the data stored in the cell.

The SRAM cell 102 is an eight transistor SRAM cell having a pair of cross-coupled inverters 320 and 322, the read port, and two pass-gate transistors. The read port comprises two NMOS transistors 330 and 332, and the pass-gate transistors are NMOS transistors 326 and 328. The inverter 320 has an input coupled to a storage node "SNB" 336 and an output coupled to storage "SN" 334. SNB 336 is the logical complement of SN 334, indicated by the "B" following the "SN". The inverter 332 has an input coupled to SN 334 and an output coupled to SNB 336. The storage nodes SN 334 and SNB 336 store the data in the SRAM cell. The pass-gate transistors are both NMOS transistors 326 and 328 that have common gates coupled to the write wordline 108, drains coupled to SNB 336 and SN 334, respectively, and sources coupled to the first write bitline 112 and the second write bitline 114, respectively. The pass-gate transistors 326 and 328 allow the cell to enter a write operation when the write wordline 108 is enabled.

The read port 324 comprises an NMOS transistor 330 having a drain coupled to the read bitline 116, a gate coupled the read wordline 110, and a source coupled to a drain of an NMOS transistor 332. The NMOS transistor 332 has a source coupled to a ground and a gate coupled to the storage node SN 334. The read port 324 allows for storage of data without distributing the data contained at the storage nodes 334 and 336.

The avoid-disturb cell 200 comprises a multiplexer 208, which is coupled to the write driver 210, the sense amplifier 212, and the Data-In bus 202. The write driver illustrated in FIG. 3 includes, but is not limited to the embodiment illustrated in FIG. 3. An embodiment of the write driver 210 comprises two PMOS transistors 337 and 338, three NMOS transistors 340, 342, and 344 and an inverter 346. A NMOS transistor 340 has a source coupled to a ground, a gate coupled to the write enable wordline 308, and a drain coupled both sources of two NMOS transistors 342 and 344. One of the NMOS transistors 342 has a drain coupled to a write driver node labeled "WDNB" 346 and a gate coupled to an output of the inverter 346, while the other NMOS transistor 344 has a source coupled to a write driver node "WDN" 348 and a gate coupled to an input of the inverter 346. A PMOS transistor 337 has a source coupled to a power supply, a drain coupled to WDNB 346 and a gate coupled to WDN 348. A PMOS transistor 338 has a source coupled to a power supply, a drain coupled to WDN 348 and a gate coupled to WDNB 346. The write driver 210 discharges either the first write bitline 112 or the second write bitline 114 from the charged level to a ground level to store the data in the SRAM cell 102.

The sense amplifier 212 illustrated in FIG. 3 includes, but is not limited to the embodiment illustrated in FIG. 3. An embodiment of a sense amplifier 212 comprises two PMOS transistors 350 and 352 and an inverter 354. The PMOS transistor 350 has a source coupled to a power supply, a gate coupled to the inverter 354 and a drain coupled to the drain of a PMOS transistor 352. The PMOS transistor 352 has a source coupled to the read bitline 116 and the gate coupled to the read enable wordline 312. The inverter 354 input is coupled to the gate of the PMOS transistor 350 and the output is coupled to the read bitline 116.

Figure 4:
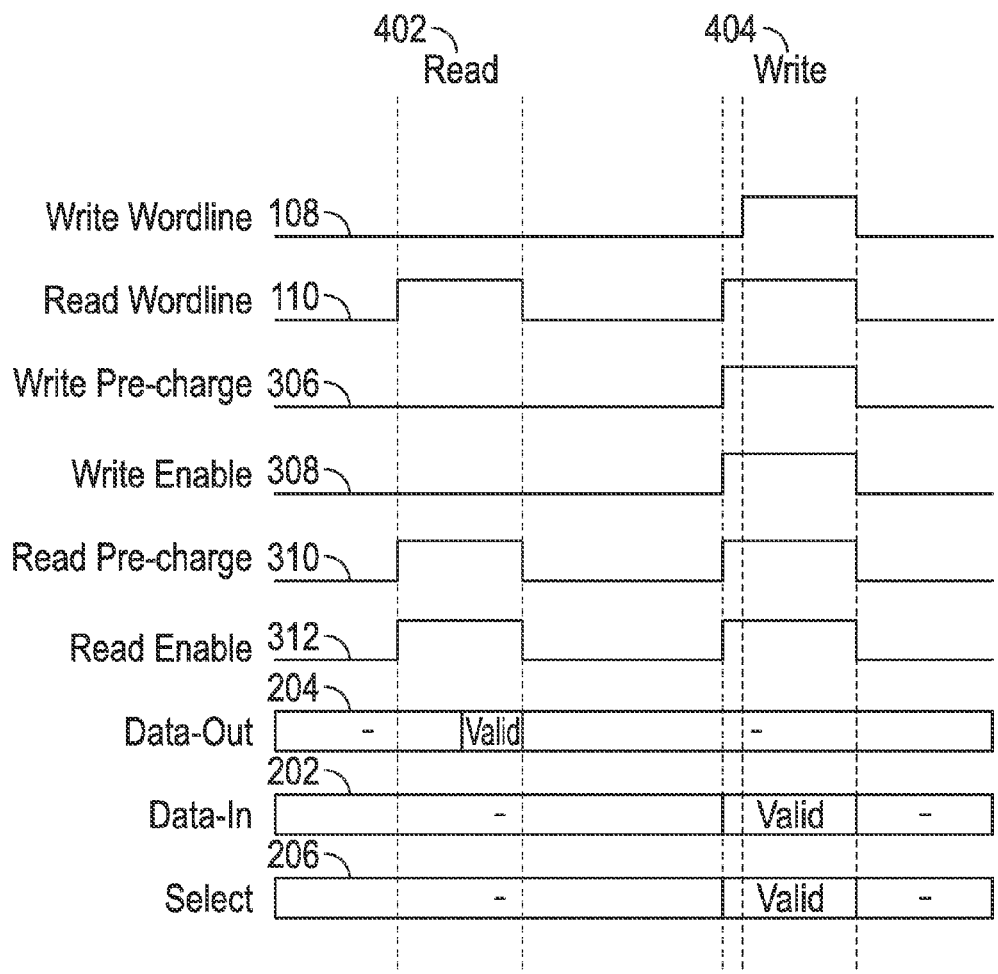
FIG. 4 is a timing diagram of various signals of the memory cell assembly of FIG. 3.

FIG. 4 is a timing diagram of various signals of the memory cell assembly 100 of FIG. 3. In a read operation 402, the read pre-charge line 310 and the read enable line 312 are enabled. The read wordline 110 is enabled to turn on the NMOS transistor 330 (FIG. 3) and the write wordline 108 is disabled to turn off the NMOS transistors 326 and 328 (FIG. 3). The read bitline is pre-charged before the read operation. If the storage node is charged, the NMOS transistor 332 (FIG. 3) will be turned on, to discharge the read bitline. If the storage node is not charged, the read bitline will remain at its pre-charged level.

In a write operation 404, the SRAM cells are selected to retain their current data state are written to from the sense amplifier, while the non-selected SRAM cells are written to from the data bus. The read and write enable lines 308 and 312, the read and write pre-charge lines 306 and 310 are enabled. The voltage on the read wordline 110 is raised above a predetermined level to turn on the NMOS transistor 330 (FIG. 3), before the voltage on the write wordline 108 is raised above a predetermined level to turn on the NMOS transistors 326 and 328 (FIG. 3). The first write bitline is pulled high to charge the storage node and the second write is pulled low to discharge the storage node or vice versa, in order to write a logical "1" or "0" to the cell. After the storage nodes have been fully charged or discharged, the write wordline is disabled to turn off the NMOS transistors 326 and 328 (FIG. 3), such that the logic "1" or "0" can be retained at the node.

Thus, there has been provided a memory array assembly and a method of operating such. The memory array assembly allows for an individual SRAM cell in a SRAM array to be written without disturbing the data contained in all cells coupled to a wordline. This permits for two other advantages in fixed and variable bus width SRAM arrays. In fixed bus width SRAM arrays, the physical array size can be decoupled from the bus width. This allows the layout dimension of the array to be tailored to the chip design. Meanwhile, in variable bus width SRAM arrays, data granularity can be improved by varying the word width and power can be conserved by only writing a subset of the SRAM cells that are required to be altered.

The invention claimed is:

1. A memory cell assembly, comprising:
   an SRAM cell providing an output data signal and comprising eight transistors two of which form a read port that is coupled to a read wordline that is separate from the write wordline that is coupled to write bitlines, wherein one of the transistors of the read port is a read port transistor that is coupled to the read wordline; and
   an avoid-disturb cell coupled to the SRAM cell, to a first source of a select signal, and to a second source of an output data signal for selectively providing one of the output data signal and the input data signal to the SRAM cell, wherein the avoid-disturb cell is coupled to a data-out bus, a data-in bus, and a select bus, wherein the read port is configured to perform a read operation and cooperates with the avoid-disturb cell to selectively provide a signal from the read port though the avoid-disturb cell to a write port without disturbing data stored in the SRAM cell, wherein the memory cell assembly is configured such that the read wordline rises above a predetermined level to turn on the read port transistor at the same time pre-charging of the write bitlines is stopped.

2. The memory cell assembly of claim 1 further comprising a sense amplifier having a input terminal coupled to an output terminal of the SRAM cell, wherein the input terminal is coupled to the output terminal via a read bitline.

3. The memory cell assembly of claim 2 further comprising a write driver having first and second output terminals coupled to first and second input terminals, respectively, of the SRAM cell, wherein the first input and second input terminals are coupled to the first and second output terminals, respectively via the write bitlines that comprise a first write bitline and a complementary second write bitline, respectively.

4. The memory cell assembly of claim 2 wherein the read wordline is coupled to the read bitline.

5. The memory cell assembly of claim 3 wherein the write wordline is coupled to the first and second write bitlines.

6. The memory cell assembly of claim 3 wherein the avoid disturb cell, comprises:
a multiplexer having an output terminal coupled to a input terminal of the write driver, a first input terminal coupled to an output terminal of the sense amplifier, a second input terminal for receiving the input data signal, and a select terminal for receiving the select signal.

7. A memory array assembly, comprising:
a plurality of SRAM cells arranged in a plurality of rows and a plurality of columns, each column providing an output data signal, and wherein each of the SRAM cells comprising eight transistors two of which form a read port that is coupled to a read wordline that is separate from the write wordline that is coupled to write bitlines and one of the transistors of the read port is a read port transistor that is coupled to the read wordline; and
a plurality of avoid-disturb cells, wherein one of the plurality of avoid-disturb cells is coupled to one of the plurality of columns, to a first source of a select signal and to a second source of an input data signal for selectively providing one of the output data signal and the input data signal to one of the plurality of column, wherein the plurality of avoid-disturb cells are coupled to a data-out bus, a data-in bus, and a select bus, and wherein each of the read ports is configured to perform a read operation and cooperates with a corresponding one of the avoid-disturb cells to selectively provide a signal from the read port though the corresponding one of the avoid-disturb cells to a write port without disturbing data stored in the corresponding SRAM cell, wherein the memory cell assembly is configured such that the read wordline coupled to a corresponding one of the SRAM cells rises above a predetermined level to turn on the read port transistor at the same time pre-charging of the write bitlines is stopped.

8. The memory array assembly of claim 7 further comprising:
a sense amplifier having a input terminal coupled to an output terminal of the column, wherein the input terminal is coupled to the output terminal via a read bitline; and
a write driver having first and second output terminals coupled to first and second input terminals, respectively of the column, wherein the first input and second input terminals are coupled to the first and second output terminals, respectively via the write bitlines that comprise a first write bitline and a complementary second write bitline, respectively.

9. The memory array assembly of claim 8 wherein a plurality of the read wordlines are coupled to one of the plurality of read bitlines, and wherein a plurality of the write wordlines are coupled to one of the plurality of the first and second write bitlines.

10. The memory array assembly of claim 8 wherein the avoid-disturb cell, comprises:
a multiplexer having an output terminal coupled to a input terminal of the write driver, a first input terminal coupled to an output terminal of the sense amplifier, a second input terminal for receiving the input data signal, and a select terminal for receiving the select signal.

11. The memory array assembly of claim 10 further comprises:
the select bus; and
a plurality of the select terminals coupled to the select bus;
the data-in bus;
a plurality of the second input terminals of the multiplexers are coupled to the data-in bus;
the data-out bus; and
a plurality of the first input terminals of the multiplexers are coupled to the data-out bus.

12. A method to avoid disturbing the data stored in selected SRAM cells in a memory array assembly while performing a write operation on the remaining SRAM cells, comprises:
providing a plurality of SRAM cells arranged in a plurality of rows and a plurality of columns, each column providing an output data signal, and wherein each of the SRAM cells comprising eight transistors two of which form a read port that is coupled to a read wordline that is separate from the write wordline that is coupled to write bitlines and one of the transistors of the read port is a read port transistor that is coupled to the read wordline;
providing a data-in bus for receiving a input data signal;
providing an avoid-disturb cell for receiving a select signal at the avoid-disturb cell, capable of assuming first and second states, wherein the avoid-disturb cell is coupled to a data-out bus, a data-in bus, and a select bus, and wherein each of the read ports is configured to perform a read operation and cooperates with a corresponding one of the avoid-disturb cells to selectively provide a signal from the read port though the corresponding one of the avoid-disturb cells to a write port without disturbing data stored in the corresponding SRAM cell including turning on the read port transistor in response to the read wordline rising above a predetermined level while at the same time stopping pre-charging of the write bitlines; and
providing one of the output data signal and the input data signal to the SRAM cell based on the state of the select signal.

13. A method according to claim 12 wherein the step of providing one of the output data signal and the input data signal to the SRAM cell, comprises:
providing a write driver and a sense amplifier;
receiving the output data signal at the sense amplifier;
coupling the sense amplifier to the write driver when the select signal is in the first state; and
writing the output data signal to the SRAM cell from the write driver.

14. A method according to claim 12 wherein the step of providing one of the output data signal and the input data signal to the SRAM cell, comprises:
providing a write driver;
coupling the data-in bus to the write driver when the select signal is in the second state; and
writing the input data signal to the SRAM cell from the write driver.

15. The method according to claim 13 wherein the memory array assembly includes a plurality of read wordlines and a plurality of write wordlines, wherein the step of writing the output data signal to the SRAM cell, comprises:
enabling one of the plurality of read wordlines prior to enabling one of the plurality of write wordlines to store the data in the SRAM cell.

16. The method according to claim 14 wherein the memory array assembly includes a plurality of write wordlines, wherein the step of writing the output data signal to the SRAM cell, comprises:
enabling one of the plurality of write wordlines to store the data in the SRAM cell.

* * * * *